US012040306B2

(12) United States Patent
Strader et al.

(10) Patent No.: US 12,040,306 B2
(45) Date of Patent: Jul. 16, 2024

(54) SYSTEMS OF APPLYING MATERIALS TO COMPONENTS

(71) Applicant: Laird Technologies, Inc., Chesterfield, MO (US)

(72) Inventors: Jason L. Strader, Cleveland, OH (US); Michael S. Wladyka, Brocksville, OH (US); Keith David Johnson, Westlake, OH (US); Jingting Yang, Fremont, CA (US); Kevin Joel Bohrer, Parma, OH (US); Mark D. Kittel, Berea, OH (US)

(73) Assignee: Laird Technologies, Inc., Chesterfield, MO (US)

( * ) Notice: Subject to any disclaimer, the term of this patent is extended or adjusted under 35 U.S.C. 154(b) by 686 days.

(21) Appl. No.: 16/988,919

(22) Filed: Aug. 10, 2020

(65) Prior Publication Data
US 2021/0028142 A1  Jan. 28, 2021

Related U.S. Application Data

(63) Continuation of application No. 16/114,687, filed on Aug. 28, 2018, now Pat. No. 10,741,519, which is a (Continued)

(51) Int. Cl.
*H01L 21/67* (2006.01)
*B32B 37/00* (2006.01)
(Continued)

(52) U.S. Cl.
CPC .......... *H01L 24/743* (2013.01); *B32B 37/025* (2013.01); *B32B 38/0004* (2013.01);
(Continued)

(58) Field of Classification Search
CPC .......... H01L 21/4882; H01L 21/67132; H01L 21/6835; H01L 24/27; H01L 24/73;
(Continued)

(56) References Cited

U.S. PATENT DOCUMENTS 1,527,009 A   2/1925  Plate
1,909,841 A   5/1933  Perryman
(Continued)

FOREIGN PATENT DOCUMENTS

EP   2814057 A2   12/2014
JP   2002110890 A   4/2002
(Continued)

OTHER PUBLICATIONS

Nguyen et al, "An Investigation of the Ink-Transfer Mechanism During the Printing Phase of High-Resolution Roll-to-Roll Gravure Printing," in IEEE Transactions on Components, Packaging and Manufacturing Technology, vol. 5, No. 10, pp. 1516-1524, Oct. 2015. (Year: 2015).*
(Continued)

*Primary Examiner* — A. Dexter Tugbang
(74) *Attorney, Agent, or Firm* — Harness, Dickey & Pierce, P.L.C.; Anthony G. Fussner

(57) ABSTRACT

A system for applying materials to components generally includes a tool operable for transferring a portion of a material from a supply of the material to a component. The tool may include a resilient material configured for tamping the portion of the material onto the component and imprinting the portion of the material for release and transfer from the supply.

20 Claims, 4 Drawing Sheets

Related U.S. Application Data continuation-in-part of application No. 15/207,444, filed on Jul. 11, 2016, now Pat. No. 11,014,203.

(60) Provisional application No. 62/562,721, filed on Sep. 25, 2017.

(51) Int. Cl.

| | |
|---|---|
| *B32B 38/00* | (2006.01) |
| *B32B 38/06* | (2006.01) |
| *H01L 21/48* | (2006.01) |
| *H01L 23/00* | (2006.01) |
| *H01L 23/367* | (2006.01) |
| *H01L 23/373* | (2006.01) |
| *H01L 23/552* | (2006.01) |
| *B23P 15/20* | (2006.01) |
| *B23P 15/26* | (2006.01) |
| *H01L 21/683* | (2006.01) |
| *H01L 31/0203* | (2014.01) |

(52) U.S. Cl.
CPC .......... *B32B 38/06* (2013.01); *H01L 21/4882* (2013.01); *H01L 21/67132* (2013.01); *H01L 23/3675* (2013.01); *H01L 23/3737* (2013.01); *H01L 23/552* (2013.01); *H01L 24/27* (2013.01); *H01L 24/97* (2013.01); *B23P 15/20* (2013.01); *B23P 15/26* (2013.01); *B32B 2457/00* (2013.01); *H01L 21/6835* (2013.01); *H01L 24/73* (2013.01); *H01L 31/0203* (2013.01); *H01L 2224/27436* (2013.01); *H01L 2224/27602* (2013.01); *H01L 2224/32245* (2013.01); *H01L 2224/83192* (2013.01); *Y10T 29/53178* (2015.01); *Y10T 29/53265* (2015.01)

(58) Field of Classification Search
CPC ....... H01L 24/97; H01L 24/743; H01L 24/75; H01L 24/83; H01L 2224/27436; H01L 2224/27602; H01L 2224/32245; H01L 2224/83192; H01L 23/3675; H01L 23/3737; H01L 23/552; B32B 37/025; B32B 38/0004; B32B 38/06; B32B 2457/00; B23P 15/20; B23P 15/26

See application file for complete search history.

(56) References Cited

U.S. PATENT DOCUMENTS

| | | | |
|---|---|---|---|
| 2,033,553 A | 3/1936 | Scholl | |
| 2,879,547 A | 3/1959 | Morris | |
| 3,168,430 A | 2/1965 | Almasi | |
| 3,404,061 A | 10/1968 | Shane et al. | |
| 3,485,912 A | 12/1969 | Schrenk et al. | |
| 3,707,762 A | 1/1973 | Bochinski et al. | |
| 3,915,780 A | 10/1975 | Broussard, Jr. et al. | |
| 4,058,537 A | 11/1977 | Mueller | |
| 4,199,490 A | 4/1980 | Kamiya et al. | |
| 4,252,331 A * | 2/1981 | Siegel .................. | Y10S 277/91 277/910 |
| 4,678,115 A | 7/1987 | Weisert | |
| 4,732,631 A | 3/1988 | Shimizu | |
| 4,863,551 A | 9/1989 | Ogura | |
| 4,872,258 A | 10/1989 | Ragard | |
| 4,924,351 A | 5/1990 | Kato et al. | |
| 5,250,784 A | 10/1993 | Muller et al. | |
| 5,700,340 A | 12/1997 | Johnson et al. | |
| 5,943,557 A | 8/1999 | Moden | |
| 6,099,678 A | 8/2000 | Kotato et al. | |
| 6,294,729 B1 | 9/2001 | Kaplo | |
| 6,391,686 B1 | 5/2002 | Shiozawa | |
| 6,566,763 B2 * | 5/2003 | Shiozawa ............... | H01L 24/97 257/782 |
| 6,896,843 B2 | 5/2005 | Topolkaraev et al. | |
| 6,947,293 B2 | 9/2005 | DiBene, II et al. | |
| 6,987,671 B2 | 1/2006 | Houle | |
| 7,004,244 B2 | 2/2006 | Rauch | |
| 7,229,683 B2 | 6/2007 | Fischer et al. | |
| 7,229,852 B2 | 6/2007 | Hoshika | |
| 7,744,991 B2 | 6/2010 | Fischer et al. | |
| 7,821,126 B2 | 10/2010 | Houle et al. | |
| 7,892,882 B2 * | 2/2011 | Leal ........................ | H01L 24/32 438/106 |
| 7,906,845 B1 | 3/2011 | Galloway et al. | |
| 7,936,062 B2 | 5/2011 | Humpston et al. | |
| 8,050,601 B2 | 11/2011 | Lin et al. | |
| 8,119,427 B1 | 2/2012 | Lu | |
| 8,445,102 B2 | 5/2013 | Strader et al. | |
| 8,545,987 B2 | 10/2013 | Strader et al. | |
| 8,916,419 B2 | 12/2014 | Chen et al. | |
| 8,920,919 B2 | 12/2014 | Arora et al. | |
| D734,732 S | 7/2015 | Nakabayashi | |
| 9,257,364 B2 | 2/2016 | Ahuja et al. | |
| 9,316,447 B2 | 4/2016 | Fleskens et al. | |
| 9,330,998 B2 | 5/2016 | Strader et al. | |
| 9,418,912 B2 | 8/2016 | Nardi et al. | |
| 9,472,485 B2 | 10/2016 | Saeidi et al. | |
| D779,997 S | 2/2017 | King | |
| D862,404 S | 10/2019 | Murata et al. | |
| D879,046 S | 3/2020 | Wladyka et al. | |
| D881,822 S | 4/2020 | Wladyka et al. | |
| 10,741,519 B2 | 8/2020 | Strader et al. | |
| D895,623 S | 9/2020 | Pille et al. | |
| D909,322 S | 2/2021 | Yoshida et al. | |
| D917,028 S | 4/2021 | Yoshida et al. | |
| D919,626 S | 5/2021 | Pille et al. | |
| 2002/0050061 A1 | 5/2002 | Komyoji et al. | |
| 2002/0155243 A1 | 10/2002 | Kobe et al. | |
| 2003/0037866 A1 | 2/2003 | Aoki et al. | |
| 2004/0180474 A1 | 9/2004 | Oman | |
| 2004/0188814 A1 | 9/2004 | Houle et al. | |
| 2004/0261980 A1 | 12/2004 | Dani et al. | |
| 2004/0262372 A1 | 12/2004 | Houle et al. | |
| 2004/0262743 A1 | 12/2004 | Houle et al. | |
| 2005/0236107 A1 | 10/2005 | Doi et al. | |
| 2005/0249909 A1 * | 11/2005 | Morishima ........ | H01L 21/67132 428/40.1 |
| 2005/0264677 A1 | 12/2005 | Uchida | |
| 2006/0021710 A1 * | 2/2006 | Nitta .................. | H01L 21/67132 156/538 |
| 2007/0193672 A1 | 8/2007 | Yamamoto | |
| 2009/0008765 A1 | 1/2009 | Yamano et al. | |
| 2009/0166021 A1 | 7/2009 | Slaton et al. | |
| 2009/0207579 A1 | 8/2009 | Boetto et al. | |
| 2009/0223638 A1 | 9/2009 | Nonaka et al. | |
| 2009/0229732 A1 | 9/2009 | Determan et al. | |
| 2009/0263938 A1 | 10/2009 | Ino | |
| 2010/0025191 A1 | 2/2010 | Kokko | |
| 2010/0071207 A1 | 3/2010 | Choi et al. | |
| 2010/0252191 A1 | 10/2010 | Nakata et al. | |
| 2011/0117706 A1 | 5/2011 | Nishio et al. | |
| 2011/0135911 A1 | 6/2011 | Maenaka et al. | |
| 2013/0316122 A1 | 11/2013 | Gresch et al. | |
| 2014/0199790 A1 | 7/2014 | Abe et al. | |
| 2014/0367847 A1 | 12/2014 | Strader et al. | |
| 2016/0160104 A1 | 6/2016 | Bruzda et al. | |
| 2016/0185074 A1 | 6/2016 | Kagawa | |
| 2016/0315030 A1 | 10/2016 | Strader et al. | |
| 2016/0326419 A1 | 11/2016 | Balandin | |

FOREIGN PATENT DOCUMENTS

| | | |
|---|---|---|
| JP | 2005327923 A | 11/2005 |
| JP | 2009164322 A | 7/2009 |
| JP | 2009277935 A * | 11/2009 |
| JP | 2012084688 A | 4/2012 |
| KR | 100827725 B1 | 5/2008 |
| WO | WO-97/41599 A1 | 11/1997 |
| WO | WO-2016182996 A1 | 11/2016 |

(56) References Cited

OTHER PUBLICATIONS

Nonfinal Office Action for U.S. Appl. No. 15/207,444, filed Jul. 11, 2016 which is the parent application to the instant application, dated Aug. 9, 2019,13 pages.
Hirschi, David; Dow Corning Case Study; Understanding Differences Between Thermal Interface Materials: Improve your ability to specify the optimum TIM; Copyright 2008, 4 pages.
Types of Fabricated Films and Pad Thermal Interface Materials—Dow Corning; Thermal Interface—Wet Dispensed; <http://www.dowcorning.com/content/etronics/etronicswet/newtim_tutoria-15.asp>; accessed Jul. 11, 2016.
Basics of Processing for Fabricated Films and Pads—Dow Corning; Thermal Interface—Wet Dispensed; http://www.dowcorning.com/content/etronics/etronicswet/newtim_tutorial13.- asp> accessed Jul. 11, 2016; 1 page.
Packaging and Storage Considerations—Dow Corning; <http://www.dowcorning.com/content/etronics/etronicswet/newtim_tutoria- 114.asp> accessed Jul. 11, 2016.
European Search Report for EP17178138.8 filed Jun. 27, 2017 which claims priority to the parent application to the instant application, dated Dec. 13, 2017, 6 pages.
Non-Final Office Action dated Jul. 11, 2016 issued by the United States Patent and Trademark Office for U.S. Appl. No. 15/207,444 which is the parent application to the instant application, 15 pages.
Final Office Action for U.S. Appl. No. 15/207,444, filed Jul. 11, 2016 which is the parent application to the instant application, dated Apr. 19, 2019, 13 pages.
Korean Office Action dated Oct. 22, 2018 issued in Application No. 10-2017-0085269 which claims priority to this U.S. Appl. No. 15/207,444 from which this application is a continuation-in-part, 15 pages. An English language translation of the KoreanOffice Action is not available at this time.
Final Office Action for U.S. Appl. No. 15/207,444 which is the parent application to the instant application, dated Mar. 13, 2020, 16 pages.
Non-final Office Action for U.S. Appl. No. 15/207,444 which names two of the same inventors and assignee but is not related through a priority claim; dated Sep. 21, 2020; 13 pages.
European Search Report for EP17178138.8 filed Jun. 27, 2017 which claims priority to the instant application, dated Dec. 13, 2017, 6 pages.
Nonfinal Office Action for U.S. Appl. No. 15/207,444, filed Jul. 11, 2016 which is the parent application to the instant application, Aug. 9, 2019, 13 pages.
Nonfinal Office Action for U.S. Appl. No. 16/114,687 which is a continuation-in-part of the instant application; Nov. 15, 2019, 12 pages.
Final Office Action for U.S. Appl. No. 16/114,687 which claims priority to the instant application; dated May 14, 2020, 13 pages.
Thermoelectric effect, Wikipedia, May 17, 2004, 15 pages; (Year: 2004).
WaybackMachine for: Thermoelectric effect, Wikipedia, May 17, 2004, 15 pages (Year: 2004).
Nonfinal Office Action for U.S. Appl. No. 17/496,889, filed Oct. 8, 2021 that names the same Assignee but is not related through a priority claim; dated Feb. 16, 2023; 16 pages.
Nonfinal Office Action for U.S. Appl. No. 29/728,991 which names 5 of the same inventors and same Assignee but is not related though a priority claim; dated Jun. 7, 2023; 9 pages.

* cited by examiner

SYSTEMS OF APPLYING MATERIALS TO COMPONENTS

CROSS-REFERENCE TO RELATED APPLICATIONS

This application is a continuation of U.S. patent application Ser. No. 16/114,687 filed Aug. 28, 2018 (issuing as U.S. Pat. No. 10,741,519 on Aug. 11, 2020), which, in turn, claims priority to and the benefit of U.S. Provisional Patent Application No. 62/562,721 filed Sep. 25, 2017. U.S. patent application Ser. No. 16/114,687 is a continuation-in-part of U.S. patent application Ser. No. 15/207,444 filed Jul. 11, 2016 (published as US2018/0009072 on Jan. 11, 2018). The entire disclosures of the above applications are incorporated herein by reference.

FIELD

The present disclosure relates to systems and methods of applying materials to components.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material. The thermal interface material may be used to fill the gap between thermal transfer surfaces, in order to increase thermal transfer efficiency as compared to having the gap filled with air, which is a relatively poor thermal conductor.

Heat spreaders are commonly used to spread the heat from one or more heat generating components such that the heat is not concentrated in a small area when transferred to a heat sink. An integrated heat spreader (IHS) is a type of heat spreader that may be used to spread the heat generated by operation of a central processing unit (CPU) or processor die. An integrated heat spreader or lid (e.g., a lid of an integrated circuit (IC) package, etc.) is typically a thermally-conductive metal (e.g., copper, etc.) plate that rests on top of the CPU or processor die.

Heat spreaders are also commonly used (e.g., as a lid, etc.) to protect chips or board-mounted electronic components often in conjunction with a sealed package. Accordingly, a heat spreader may also be referred to herein as a lid and vice versa.

A first thermal interface material or layer(s) (referred to as TIM1) may be used between an integrated heat spreader or lid and a heat source to reduce hot spots and generally reduce the temperature of the heat generating components or device. A second thermal interface material or layer(s) (referred to as TIM2) may be used between the lid or integrated heat spreader and the heat sink to increase thermal transfer efficiency from the heat spreader to the heat sink.

For example, FIG. 1 illustrates an exemplary electronic device 11 having a TIM1 or first thermal interface material 15. As shown in FIG. 1, the TIM1 or thermal interface material 15 is positioned between a heat spreader or lid 19 and a heat source 21, which may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.), batteries, solar panels, etc. A TIM2 or second thermal interface material 25 is positioned between a heat sink 29 and the heat spreader or lid 19.

By way of example, the heat source 21 may comprise a central processing unit (CPU) or processor die mounted on a printed circuit board (PCB) 33. The PCB 33 may be made of FR4 (flame retardant fiberglass reinforced epoxy laminates) or other suitable material. Also in this example, the heat spreader or lid 19 is an integrated heat spreader (IHS), which may comprise metal or other thermally-conductive structure. The heat spreader or lid 19 includes a perimeter ridge, flange, or sidewall portions 37. Adhesive 41 is applied to and along the perimeter ridge 37 for attaching the heat spreader or lid 19 to the PCB 33. The perimeter ridge 37 may thus protrude sufficiently downward to extend around the silicon die on the PCB 33 and thereby allow contact between the adhesive 41 on the perimeter ridge 37 and the PCB 33. Advantageously, adhesively attaching the heat spreader or lid 19 to the PCB 33 may also help stiffen the package, which is attached to the base PCB. Also shown in FIG. 1 are pin connectors 45. The heat sink 29 may generally include a base from which outwardly protrude a series of fins.

As another example, an exemplary electronic device may include a thermal interface material positioned between a heat source and a heat sink without any intervening heat spreader between. In this example, the thermal interface material may thus be positioned directly between and/or against the heat sink and the heat source, which may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.), batteries, solar panels, etc.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

Conventional phase change material (PCM) application processes oftentimes include tabbed PCM parts and are relatively high in cost. There may be issues with the end users or customers applying the tabbed parts correctly and/or issues with the liner release. With conventional application processes, the part configurations, shape, and size of the TIM are limited. Also, it can be difficult to keep the PCM material clean during any additional steps after forming in a clean room. It can also be difficult to ship tabbed parts without distortion.

After recognizing the above, the inventors hereof developed and disclose herein exemplary embodiments of systems and processes for applying (e.g., pushing, pressing, tamping, removing, severing, tearing, cutting, blowing, imprinting, transferring from a supply, etc.) a wide range of materials (e.g., thermal interface materials (TIMs), electrically-conductive elastomers, electromagnetic interference (EMI) absorbers, EMI shielding materials, dielectric materials, thermally-conductive materials, other interface materials, combinations thereof, individual layers, stacked layers thereof, etc.) to a wide range of parts, substrates, and components, such as lids or integrated heat spreaders of integrated circuit (IC) packages, board level shields (e.g., a removable lid or cover of a board level shield (BLS), etc.), heat sources (e.g., a central processing unit (CPU), etc.), heat removal/dissipation structures or components (e.g., a heat spreader, a heat sink, a heat pipe, a vapor chamber, a device exterior case or housing, etc.), a series of connected heat pipes (e.g., FIG. 4, etc.), uneven surfaces, surfaces having ridges, films, other substrates, etc.

Figure 3:
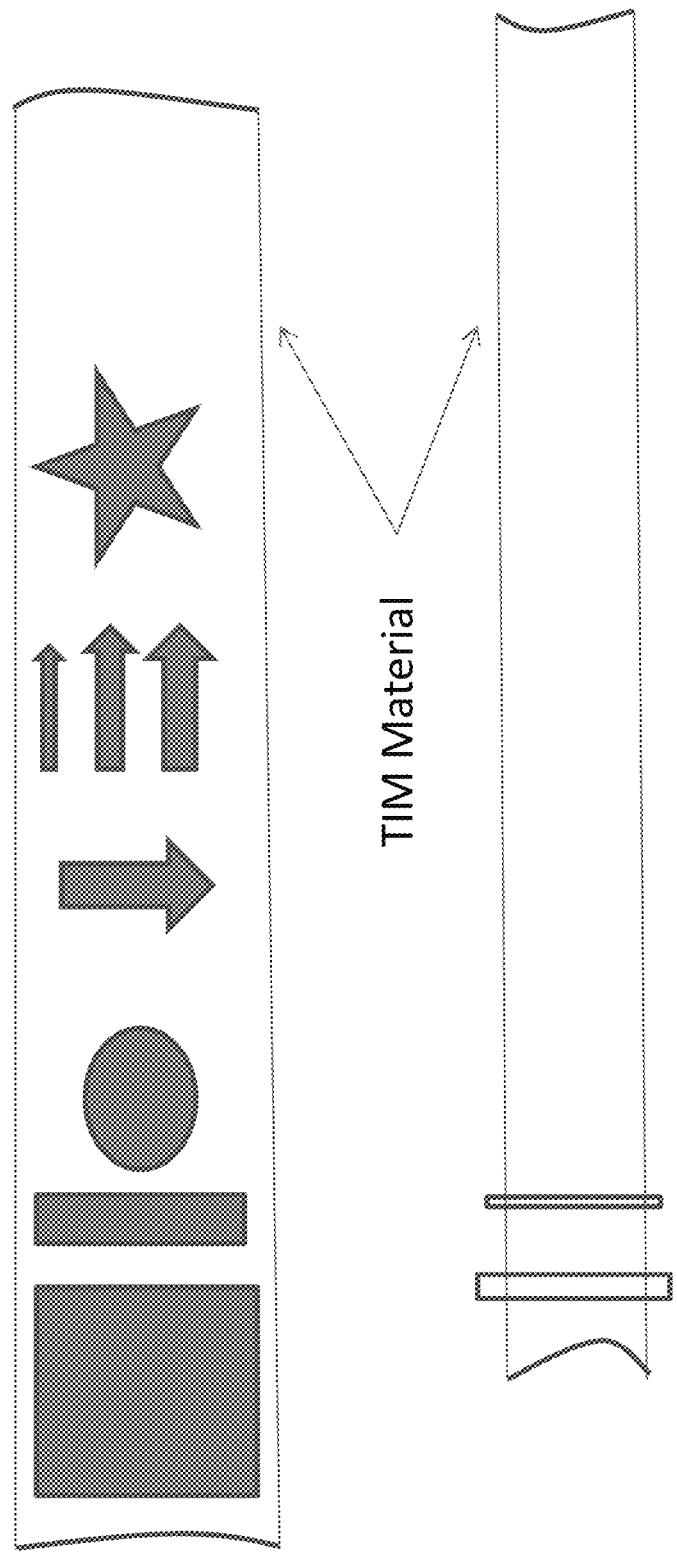
FIG. 3 illustrates exemplary shapes (e.g., star, arrow, square, rectangular, oval, etc.) that are possible for the thermal interface materials using the system according to the exemplary embodiment shown in FIG. 2.

In exemplary embodiments, a tool is used to transfer the TIM or other material from a delivery liner (broadly, a supply) to the target part, component, or substrate. The tool may comprise a die that is tailored or customized (e.g., shaped and sized, etc.) according to a customer required size and shape (e.g., one or more of the shapes shown in FIG. 3, etc.). In operation, the die may be moved relative to (e.g., downwardly, upwardly, laterally, diagonally, rotationally, etc.) and pressed through a liner (e.g., a polyethylene terephthalate (PET) carrier and/or release liner, etc.) disposed along a surface (e.g., a top or upper surface) of a supply (e.g., roll, reel, etc.) of thermal interface material (e.g., phase change material (PCM), other TIM, etc.) or other material (e.g., electrically-conductive elastomer, electromagnetic interference (EMI) absorber, EMI shielding material, dielectric material, combinations thereof, individual or stacked layers thereof, etc.). In some embodiments, the die may be moved relative to and pressed through the liner along with pressure, dwell, heating, and cooling, which may aid in cutting, adhesion, release of the TIM or other material from the liner, temperature control, etc.

The movement of the die relative to the liner also moves a portion of the TIM or other material for transfer or application from the supply onto a substrate or component. When the die is removed and moved relatively away (e.g., raised upwardly away, etc.) from the TIM or other material, the liner is also removed from the portion of the TIM or other material. The portion of the TIM or other material in the specific customer required size and shape remains left behind, e.g., on the lid, BLS, heat source, heat removal/dissipation structure, etc. During the removal of the TIM or other material from the supply, the die may be configured to reduce the material thickness, create adhesion, and tear the TIM or other material from the supply.

The machine or press used to press the die (e.g., downwardly, upwardly, laterally, diagonally, rotationally, etc.) through the liner may range from a manual hand operated press to a highly automated machine. In some embodiments, at least a portion of the liner may remain on the portion of the TIM or other material that was applied to the substrate or component, where the remaining liner portion may be useful for protection, labeling, provide tabs, and/or other reasons.

In exemplary embodiments, the supply of material comprises a supply (e.g., roll, reel, tape, etc.) of thermal interface material, such as phase change material (PCM) or other non-metal TIM (e.g., plastic TIM, silicone elastomer TIM, etc.). In other exemplary embodiments, the supply of material may include a wide range of other materials, such as other TIMs, non-thermally enhanced materials, thermal insulators, dielectric insulation, electrical insulators, electrically-conductive elastomers, EMI absorbers, EMI shielding materials, polymeric materials, adhesive materials, other interface materials, combinations thereof, individual layers thereof, stacked layers thereof, etc.).

In exemplary embodiments, a tamping tool is used to tamp the TIM or other material onto the substrate or component (e.g., lid, BLS, heat source, heat removal/dissipation structure, etc.). The tamping tool may include a cavity and a resilient material (e.g., cotton, cork, gel, gel packs, rubber, elastomer, resilient plastic, springy or sponge-like material, fibrous material, insulation material, other resilient material, etc.) within the cavity. For example, the tamping tool may include a center foam core or foam filled core. Alternatively, the tamping tool may include another resilient material within the cavity or no cavity at all.

A die may be used to remove (e.g., cut, tear, sever, etc.) the TIM or other material through the liner without having to puncture the liner. The die may be integral with or separate from the tamping tool. In exemplary embodiments, the TIM or other material is non-metal such that there is no diffusion bonding or welded joints between the non-metal and the substrate or component (e.g., lid, BLS, heat source, heat removal/dissipation structure, etc.). Instead, the non-metal may be naturally tacky and self-adhere to the substrate or component without any additional adhesive needed (although adhesives could also be used).

The die may comprise one or more blades and/or at least one edge configured (e.g., flat, pointed, sharp, etc.) for cutting, tearing, or severing the TIM or other material from the supply. In exemplary embodiments, the die may comprise a blade die (e.g., steel blade die, etc.), a knife die (e.g., rounded knife die, etc.), a steel ruled die having a knife, rounded, or dulled edge, a rotary die, etc. In an alternative embodiment, the die comprises an integrated circuit die (e.g., a block of semiconducting material, etc.) having one or more edges for cutting, severing, or tearing the TIM or other material that is tamped onto the integrated circuit die by the tamping tool. In yet another embodiment, the tamping tool may be operable for cutting, tearing, or severing the TIM or other material without using a separate die (e.g., without using blades of a knife die, etc.). In this latter example, the tamping tool may comprise a resilient material (e.g., foam filled cavity, center foam core, etc.) that is usable for tamping and transferring (e.g., cutting, tearing, severing, etc.) the TIM or other material from a supply (e.g., roll, reel, tape, etc.) onto a substrate or component.

In an exemplary embodiment, a rolling rotary die may be used to apply or transfer a TIM or other material from a supply onto components or substrates. For example, the rolling rotary die may be used to apply or transfer a portion of a TIM or other material from a reel or roll onto a surface of a component or substrate. This example may be a reel-to-reel or roll-to-roll process in which the rotary die is between the supply reel or roll and the take-up or salvage reel or roll. The system components may be run at a given speed such that there is a rotary transfer of the portions of the material from the supply roll or reel to the surface of the substrate or component.

In exemplary embodiments, the TIMS and other materials may be provided with textured and/or modeled surfaces during the application or transfer from a supply onto the components or substrates. Accordingly, exemplary embodiments disclosed herein include methods for texturing surfaces and/or creating textured or modeled surfaces on a TIM and other materials. A TIM or other material may be transferred from a carrier or delivery liner or other supply to a heat sink, lid, other part, substrate or component, etc. It has been discovered that the slightest imperfections in the liner are also transferred into the TIM or other material during the application/transfer process. For example, the thickness of an ink used for a logo on the liner may be imprinted into the TIM or other material being applied or transferred from the liner to the component or substrate. As another example, a textured portion of a tool (e.g., a textured foam core of a die, a textured resilient material within a cavity of a die, etc.) may be used to provide texturing to a surface of the TIM or other material when the textured portion of the tool is used to tamp, press against, or otherwise apply the TIM or other material from a carrier liner to a component or substrate. As a further example, a standalone stencil may also be used between a carrier liner and a tool (e.g., a foam core of a die, etc.) during the transfer process to create and leave a texture on a surface of the TIM or other material being transferred from the carrier liner to a component or substrate. As yet another example, one or more markings from an item between a backside of a foam core (or other resilient material) and a tool may also be transferred therefrom to provide texturing to a surface of the TIM or other material being transferred to a component or substrate. This discovery allows for microtexturing of the TIM and other materials during the application/transfer process. The texturing of the surface may improve or aide in air removal and pressure reduction during assembly. The texturing of the surface may reduce contact resistance and make the TIM or other material softer and more compliant. The texturing may also be used to create identifying marks on the TIMs and other materials being transferred or applied from the liners or other supplies. Microtextured surfaces on a TIM or other material may also provide benefits for EMI shielding and/or absorbing. Electrically-conductive ink or other electrically-conductive substance on the liner may be transferred from the liner to the TIM or other material to thereby create a textured surface (e.g., frequency selective surface (FSS), grid, etc.) for EMI shielding purposes.

In exemplary embodiments, the liner may be entirely removed and not left behind as only the portion of the TIM or other material may be transferred from the liner and remain on the component or substrate. In alternative embodiments, at least a portion of a carrier liner may remain on the portion of the TIM or other material that was transferred from the carrier liner to the substrate or component. By way of example, this may be accomplished by cutting through the carrier liner with high pressure and/or a sharp die. The remaining portion of the carrier liner that was transferred along with the TIM or other material from the carrier liner may be useful for protection as a protective cover, for labeling, for providing tabs, and/or other reasons. In other embodiments, a downstream secondary action may be employed to subsequently add a cover, tab, or liner to the portion of the TIM or other material that was previously applied to the substrate or component. The subsequently added cover, tab, or liner may be useful for protection as a protective cover during transport, provide labeling, provide tabs, and/or other reasons. For example, if the parts are not assembled in a timely manner, the TIM or other material may be susceptible to contamination or other defects such that a protective cover may be beneficial, e.g., during transportation, during installation and assembly, etc.

In exemplary embodiments, a tool (e.g., a die, etc.) is used to transfer TIM or other material from a supply onto the substrate or component (e.g., lid, BLS, heat source, heat removal/dissipation structure, etc.). The tool may include a cavity and a resilient material within the cavity. The resilient material may comprise a specifically shaped piece of foam that allows for air entrapment to be mitigated and removal of air pockets. The foam shape may be configured to apply material air/bubble free on larger part sizes (e.g., greater than 20 millimeters (mm), etc.). The shape of this foam may be cylinder shaped or cylindrical, hemispherical, chamfered, or a flat piece that is inserted into a die in such a way that the surface is curved (e.g., oversized or standoff, etc.).

Due the nature of the materials involved, application of irregular and/or intricate geometry parts are not possible by the traditional peel and stick method. Instead, the traditional peel and stick method parts are usually limited to squares or rectangles. Exemplary embodiments disclosed herein may be used to apply or transfer parts or portions of a TIM or other material, which have intricate geometries and/or irregular shape, such as circles, letters, parts with negative space, other shapes, such as the shapes shown FIG. 3 (e.g., star, arrow, square, oval, etc.), etc.

In some exemplary embodiments, a single part or portion of a thermal interface material (TIM) or other material may be applied or transferred to a single component or substrate in a single action (e.g., a single stroke, single press of a die, etc.). In other exemplary embodiments, multiple parts or portions of the same or different TIMs and/or other materials may be applied or transferred at the same time to different areas of the same single component or substrate, e.g., in a single action or stroke of a multiple up die, etc. In further exemplary embodiments, multiple parts or portions of the same or different TIMs and/or other materials may be applied or transferred at the same time (e.g., in a single press of a die, etc.) to multiple components or substrates, e.g., by using a multiple up die and the parts are staggered and the TIM or other material is wide enough, etc.

In some exemplary embodiments, a single action (e.g., a single stroke, single press of a die, etc.) is performed that includes tacking a TIM or other material to a component or substrate using a foam core (or other resilient material) and imprinting the TIM or other material for release using a die edge (e.g., edge of a steel ruled die, knife die, integrated circuit die, etc.). The tacking and imprinting may be accomplished in a single stroke. In other exemplary embodiments, multiple actions (e.g., multiple strokes, etc.) may be performed for the tacking and imprinting of the TIM or other material. This may include first tacking or pre-tacking the TIM or other material with a foam or other resilient material, then in a separate action using a die (e.g., a blade die, steel ruled die, knife die, integrated circuit die, etc.) to imprint the TIM or other material for release. The pre-tacking and imprinting may either be done on the same machine or on separate machines. Advantageously, tacking and imprinting in separate actions may help mitigate air entrapment and/or allow for a faster overall process.

In some exemplary embodiments, multiple actions (e.g., multiple strokes, multiple print actions, etc.) may be performed to stack materials (e.g., TIMs on TIMs, etc.) either of the same material or different materials. Advantageously, this can allow for less SKUs (stock keeping units) by allowing a single thickness to be built up through multiple actions in a same location (e.g., 25 micron thick layers built to a final thickness, etc.). This can also allow for different layers to be placed or stacked on top of each other, such as a bottom or first TIM layer, a middle or second dielectric layer, and a top or third TIM layer, etc. This can also allow for easier rework where not enough material was added.

In some exemplary embodiments, a die is used to make an imprint in the TIM or other material to be transferred. For example, the edges of a raised pedestal or integrated circuit may be used to make the imprint needed for the release and transfer of the TIM or other material from the supply. A piece of an oversized resilient material (e.g., foam, etc.) or an oversized die including a core or cavity filled with a resilient material (e.g., foam, etc.) may be used to complete the transfer of the imprinted TIM or other material to the raised pedestal or integrated circuit. Advantageously, this process may allow for covering an entire surface of the raised pedestal or integrated circuit with the TIM or other material.

Sometimes, thermal interface materials or other materials may be required on both sides of a part, substrate, or component. In some exemplary embodiments, dual heads (e.g., dual print heads, etc.) may be used that push a target part, component, or substrate in an up/down, left/right, rotary, etc. movement to apply thermal interface materials or other materials on both sides of the target part. The material applied to one side may be the same as or different than the material applied to the other side of the part. By simultaneously applying TIM or other material to both sides of the part, exemplary embodiments may allow for reduced handling and fixturing time and/or costs as compared to processes in which TIMs may be applied sequentially and not simultaneously to both sides of a part.

Due to the configuration or design of the target components, it may sometimes be necessary to print, apply, or transfer TIM or other materials in various directions in addition to up/down directions. Some exemplary embodiments include multi-directional printing functionality such that the TIM or other materials may be printed, applied, or transferred to target components in various directions, including but not limited to, up/down, lateral, diagonal, rotary, inverted, etc. This may include printing, applying, or transferring the TIM or other material on multiple sides (e.g., double sided, etc.) or multiple target surfaces.

Figure 1:
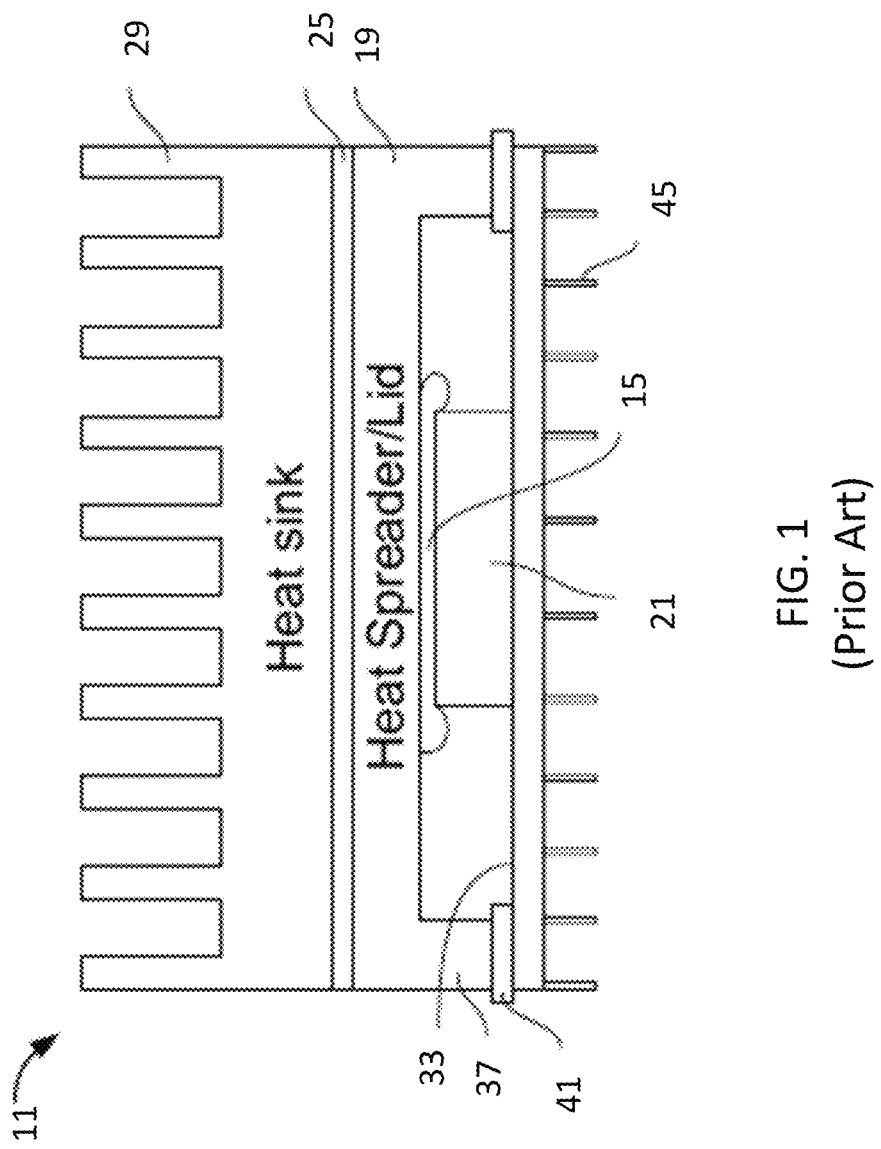
FIG. 1 is a cross-sectional view of an exemplary electronic device showing a thermal interface material (TIM1) positioned between a lid (e.g., integrated heat spreader (IHS), etc.) and a heat source (e.g., one or more heat generating components, central processing unit (CPU), die, semiconductor device, etc.).
Figure 2:
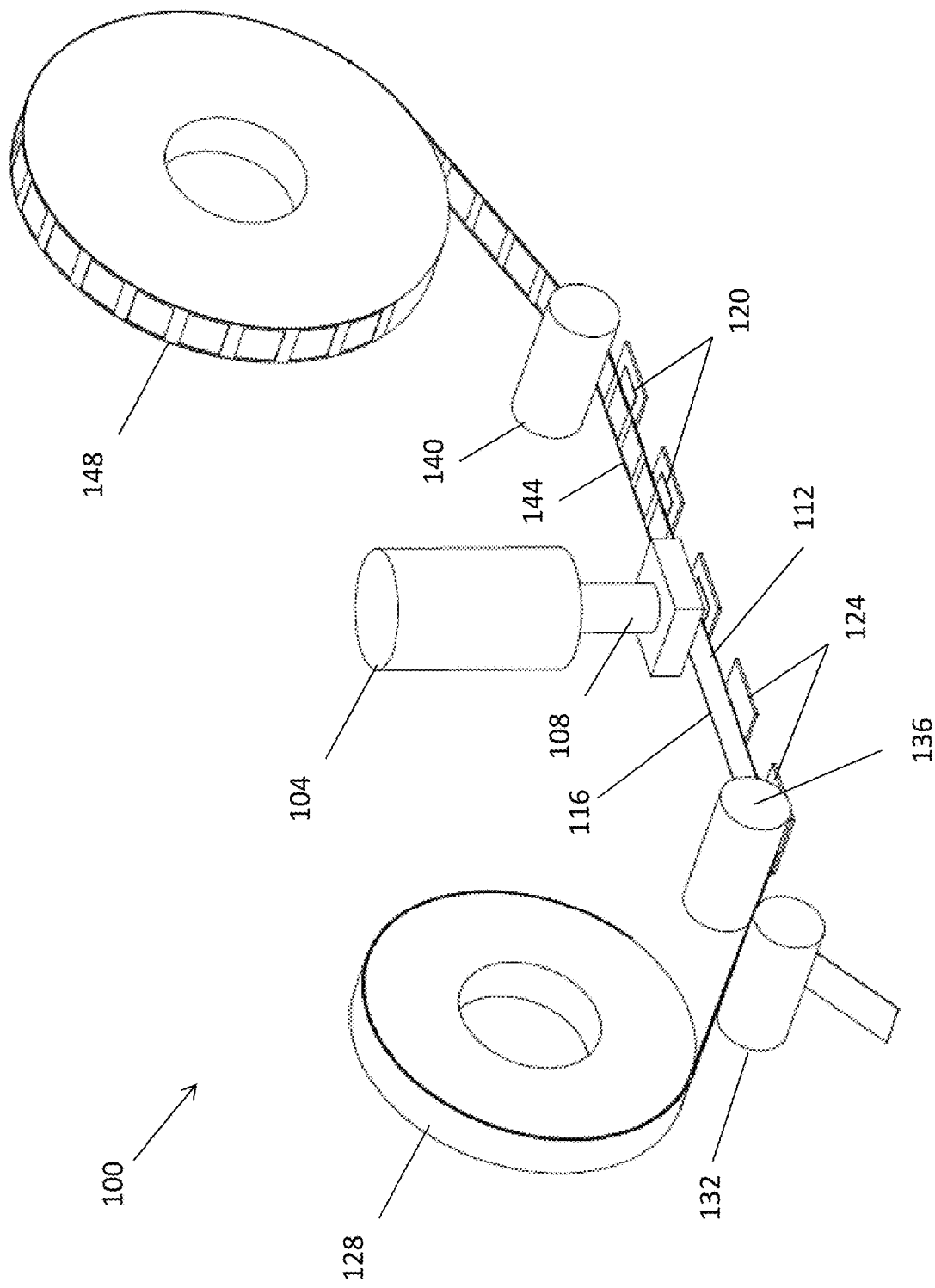
FIG. 2 illustrates an exemplary system for applying thermal interface materials to lids according to an exemplary embodiment.

With reference to the figures, FIG. 2 illustrates an exemplary system 100 for applying (e.g., transferring from one or more supplies, etc.) materials to components according to an exemplary embodiment embodying one or more aspects of the present disclosure. Although FIG. 2 shows thermal interface materials 120 (broadly, materials) being applied to lids or integrated heat spreaders 124 (broadly, components), the system 100 may also be used for applying thermal interface materials 120 and other materials to a wide range of other components and substrates, such as board level shields (e.g., a removable lid or cover of a board level shield (BLS), etc.), heat sources (e.g., a central processing unit (CPU), etc.), heat removal/dissipation structures or components (e.g., a heat spreader, a heat sink, a heat pipe, a vapor chamber, a device exterior case or housing, etc.), etc. Accordingly, aspects of the present disclosure should not be limited to use with any single type of material, substrate, part, component or limited to application or transfer of materials to any specific location or portion of the substrates, parts, or components.

As shown in FIG. 2, the system 100 includes a press 104 coupled with a die 108. In operation, the press 104 and die 108 are operable for tamping and cutting, severing, tearing, etc. the portion of the strip or tape 112 that includes a liner 116 and thermal interface material (TIM) 120 that is underneath the die 108. As disclosed herein, alternative embodiments may include tools configured differently than the press 104 and die 108.

By way of example, the die 108 may comprise a rounded knife die. The rounded knife die may include a foam filled core. In alternative embodiments, the die 108 may include a cavity or core filled with a different resilient material, such as cotton, cork, gel, gel packs, rubber, elastomer, resilient plastic, springy or sponge-like material, fibrous material, insulation material, etc. In yet other embodiments, the die 108 may not require a core filled with resilient material depending on the particular type of material being applied or transferred by the system 100.

In this example, the foam filled core of the die 108 may tamp the TIM 120 downward onto a corresponding one of the lids 124 located underneath the die 108. Then, the rounded knife die may be used to remove (e.g., cut, tear, sever, etc.) the TIM 120 through the liner 116, e.g., without having to puncture the liner 116, etc. During this removal operation, the TIM 120 is squeezed down and the liner 116 is pushed through the TIM 120 with the die 108, which causes the severing, tearing, or cutting of the TIM 120 from itself without cutting the liner 116. Although a very thin portion of the TIM 120 may be left between the lid 124 and the liner 116, the portion is so thin that it breaks free from the rest of the TIM 120 essentially cutting the TIM 120. By way of example, the TIM 120 may start at an initial thickness of about 125 microns. The die 108 may force the liner 116 down into the TIM 120 until the TIM thickness is reduced to about 25 microns or is pushed out of the way. Accordingly, the TIM 120 may thus have tapered edges on all four sides due to this method.

As shown in FIG. 2, the TIM 120 may remain on the lid 124 when the die 108 is removed and the next portion of the strip 112 and the next lid 124 is moved into place under the die 108. By way of example, the lids 124 may progress or move relative to the die 108 via a conveyor belt or other feeding/conveyor mechanism.

In this illustrated embodiment, the strip of material 112 that includes the liner 116 and TIM 120 is roll stock from a supply or roll 128. Rollers 132, 136, 140 are used to cause the strip of material 112 to unroll from the supply 128 of roll stock and travel to the location underneath the die 108 for tamping and cutting. After the TIMs 120 has been tamped and removed from the strip 112 and applied and transferred to the lids 124, what is left of the strip of material 144 may be collected or salvaged, e.g., wound onto a salvage roll 148, allowed to fall into a waste basket, etc. In other embodiments, more or less rollers may be used and/or strips of material that do not come on rolls may be used. In which case, the strips of material may be put in place by hand, with a jig, or by an automated means.

In an exemplary embodiment, the system 100 preferably uses as much of the strip of material as possible to thereby minimize or at least reduce waste (e.g., minimize the amount of TIM material left on the liner, etc.) during the application process. As shown in FIG. 2, the lids 124 are spaced apart by a greater distance than which the strip 112 is advanced after each tamping and cutting (broadly, removing) operation. After each tamping and cutting operation, the strip 112 is advanced only enough (e.g., a minimum distance, etc.) to allow the next portion of the strip 112 to be tamped and cut, severed, torn, etc. in order to apply the TIM 120 to the next lid 124. In an exemplary embodiment, the width of the TIM 120 along the liner 116 may be equal to the width of the pieces of the TIM 120 that are tamped and applied/transferred to the lids 124. In another exemplary embodiment, the width (e.g., 1 inch, etc.) of the TIM 120 along the liner 116 may be greater than the width (e.g., ¾ inches, etc.) of the pieces of the TIM 120 that is tamped and applied/transferred to the lids 124.

In exemplary embodiments, the strip of material 112 may also include a lower liner disposed along a lower surface or bottom of the TIM 120. In such embodiments, the lower liner may be manually removed by hand or automatically without manual intervention (e.g., with a rewind and stripper bar, etc.) before the die 108 applies the TIM 120 to the lids 124.

In exemplary embodiments, the system 100 may include one or more heaters such that heat is applied or added to the top and/or such that heat is applied or added to the base or bottom. The heat may aid in the cutting, tearing, severing, etc. of the material and/or adhesion of the material to the components. Or, for example, the heat may be used to cut or otherwise remove (e.g., without a knife or blade, etc.) the material portions from the supply. Additionally, or alternatively, the system 100 may be configured with cooling, e.g., added to the top part and die used to cut the TIM, etc. A die may be added to the top plate in some exemplary embodiments.

The roll 128 (broadly, supply) may be provided in various sizing, such as 0.5 inches (12.7 millimeters (mm)), 1 inch (25.4 mm), etc. The roll width may be selected based on the part size. For example, a roll having a width of 0.5 inches (12.7 mm) may be used if the lid 124 (broadly, part) is 10 mm×5 mm. The roll 128 is placed onto an unwind and threaded through the application machine or system 100. If the roll 128 includes a lower liner, the lower liner may be removed as the material advances with small rewind. The lids 124 and die 108 may be oriented in the application machine or system 100 to maximize usage of the thermal interface material. The lids 124 may be placed in a jig for application step to ensure good or perfect positioning and TIM placement. For low volumes, the orientation may be performed manually by hand although for high volumes the orientation may be performed automatically, e.g., by an automated table (e.g., turntable or other, etc.). The system 100 may include a sensor system to advance the rolled TIM material for the next TIM application. Alternatively, the system 100 may be configured with a set distance advance process. Heat and cooling may be provided to improve application robustness.

Figure 4:
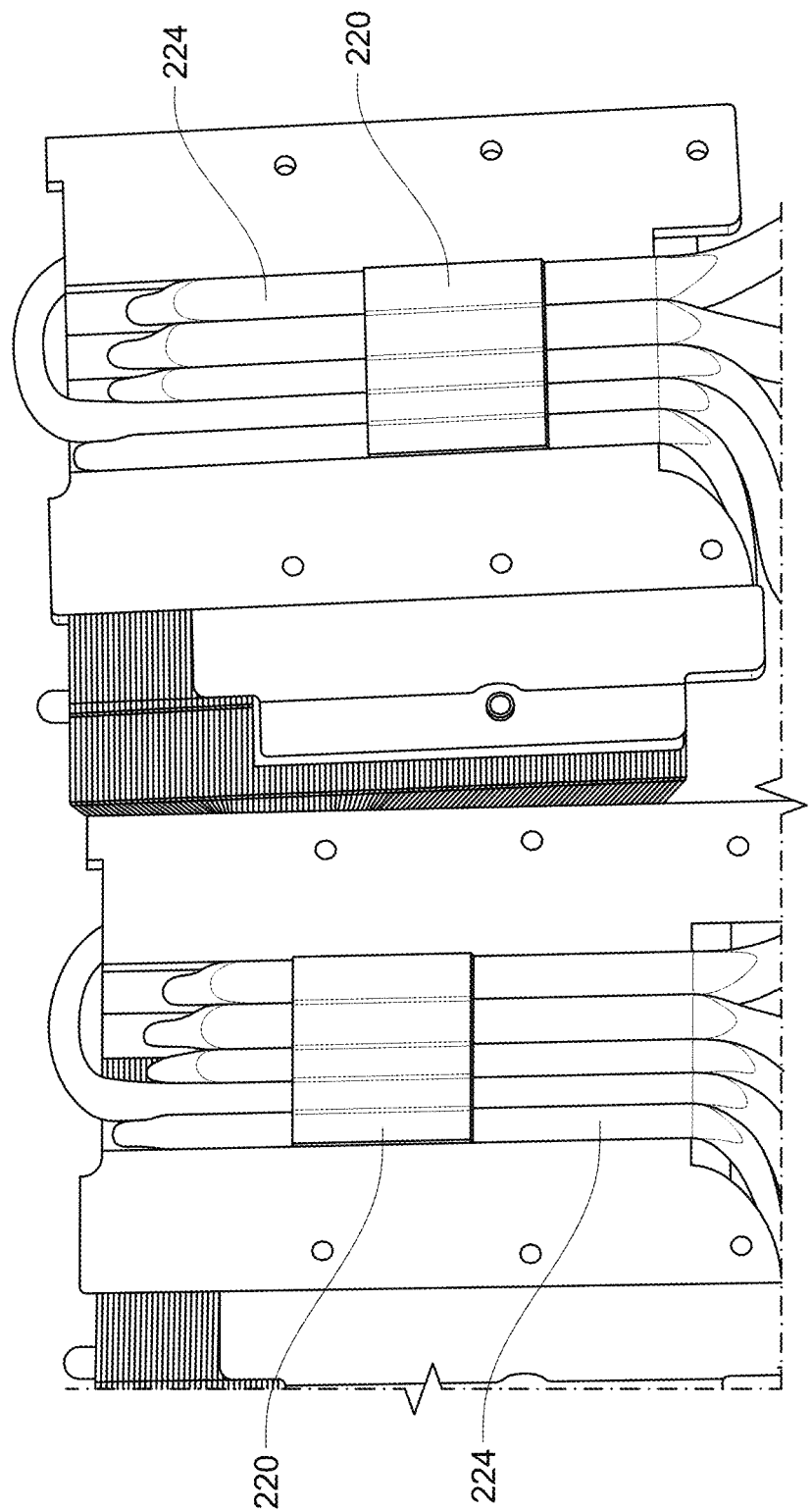
FIG. 4 illustrates thermal interface materials applied along portions of connected heat pipes, where the thermal interface materials were applied using a system disclosed herein according to an exemplary embodiment.

FIG. 4 illustrates thermal interface materials 220 (broadly, materials) applied along portions of connected heat pipes 224 (broadly, components) by using an exemplary system (e.g., system 100 shown in FIG. 2, etc.) disclosed herein according to an exemplary embodiment. As shown by FIG. 4, the systems disclosed herein may be used to apply thermal interface materials 220 (and other materials disclosed herein) to a wide variety surfaces, including flat surfaces, uneven surfaces, surfaces having ridges, etc.

Exemplary embodiments are disclosed of systems for applying (e.g., transferring from a supply, etc.) thermal interface material and other materials to components. For example, a thermal interface material or other material may be applied to a wide range of substrates, components, and parts, such as lids or integrated heat spreaders of integrated circuit (IC) packages, board level shields, heat sources (e.g., a central processing unit (CPU), etc.), heat removal/dissipation structures or components (e.g., a heat spreader, a heat sink, a heat pipe, a vapor chamber, a device exterior case or housing, etc.), etc.

In an exemplary embodiment, the system may include a supply of material (e.g., a roll, reel, or tape of thermal interface material or other material, etc.) and a tool (e.g., a die, etc.). The tool may be operable for pushing against (e.g., tamping, etc.) and removing (e.g., cutting, tearing, shearing, severing, separating, etc.) a portion of the material from the supply that is between the tool and a component.

The material may comprise a non-metal. The portion of the material may be coupled to the component without any diffusion bonding or welded joints therebetween.

A liner may be along a surface of the supply of material. The tool may be operable for removing the portion of material from the supply through the liner. For example, the tool may be operable for pushing the liner through the portion of the material for severing the portion of the from the supply without having to puncture the liner.

The tool may comprise a die operable for tamping and cutting the portion of the material from the supply that is between the tool and a corresponding one of the components. For example, the tool may comprise a rounded knife die with a foam filled core. The foam filled core may be usable for tamping the portion of material downward onto the component. The rounded knife die may be usable to cut the portion of material from the supply through the liner.

The system may be configured such that the portion of material remains on the component and such that the liner is removed from the portion of material when the tool is removed and moved (e.g., raised upwardly, etc.) away from the portion of material. The system may be configured such that the portion of material remains on the component when the tool is removed and a next portion of the supply of material and a next component is moved into place for application of the material thereto.

The system may comprise a sensor system to advance the supply of material for the next application to a subsequent component. Or, the system may be configured with a set distance advance process for the supply of material. The system may include jigs in which the components are placed and oriented relative to the die for placement of the material onto the components. The components may comprise lids or integrated heat spreaders of integrated circuit (IC) packages, board level shields, heat sources (e.g., a central processing unit (CPU), etc.), heat removal/dissipation structures or components (e.g., a heat spreader, a heat sink, a heat pipe, a vapor chamber, a device exterior case or housing, etc.), etc.

The system may be configured with heating and/or cooling features (e.g., recirculating heater/chiller, etc.) for applying heat and/or cooling during application of the material to the components, which may aid in cutting, adhesion, release of the TIM or other material from the liner, temperature control of the components and substrates, etc. For example, heat may aid in the cutting of the material and/or adhesion of the material to the components. Or, for example, heat may be used to cut or otherwise remove (e.g., without a knife or blade, etc.) the portions of the material from the supply.

The system may include a roll of the supply of material. Rollers may be provided for causing the supply of material to unroll from the roll and travel to a location aligned with the tool. A salvage (e.g., a salvage roll, waste basket, etc.) may be used for collecting an unused portion of the supply of that remains after the material has been applied to the components. The material may be thermal phase change material with or without any tabs. As another example, a system or method may be configured to apply (e.g., transfer from a roll, etc.) a thermal interface material or other material to a substrate, such as a film in order to make a tabbed product, etc.

Exemplary embodiments are also disclosed of methods of applying material to components. For example, a thermal interface material or other material may be applied to a wide range of substrates and components, such as lids or integrated heat spreaders of integrated circuit (IC) packages, board level shields, heat sources (e.g., a central processing unit (CPU), etc.), heat removal/dissipation structures or components (e.g., a heat spreader, a heat sink, a heat pipe, a vapor chamber, a device exterior case or housing, etc.), etc.

In an exemplary embodiment, a method generally includes tamping and removing (e.g., cutting, tearing, shearing, severing, separating, etc.) a portion of a material from a supply of the material that is aligned with a component, such that the portion of the material is applied to the component without diffusion bonding of the portion of thermal interface material to the corresponding one of the components.

The tamping and removing may comprise pressing a tool (e.g., die, etc.) through a liner disposed along a surface of the supply of material such that the portion of the material remains on the component and such that the liner is removed from the portion of the material when the tool is removed and moved relatively away from the portion of the material. The method may include using the tool to push the liner through the portion of the material to thereby sever the portion of the material from the supply without puncturing the liner.

The tamping and removing may comprise using a tool to tamp and remove the portion of the material from the supply that is between the tool and the component.

The tool may comprise a die, such as a rounded knife die with a foam filled core, etc. In which case, the method may include using the foam filled core for tamping the portion of the material onto the component and using the rounded knife die to cut the portion of the material from the supply of material.

The method may include advancing a corresponding one of the components having the portion of material thereon away from the tool; and advancing the supply of material and a next component into place aligned with the tool for application of the material to the next component. Advancing the supply of the material may comprise using rollers to cause the supply of the material to unroll from a supply roll and travel to a location aligned with the tool. The method may include collecting an unused portion of the supply of the material that remains after the material has been applied to the components.

The material may comprise a non-metal. The method may include coupling the portion of the material to the component without any diffusion bonding or welded joints therebetween.

The method may include advancing the supply of the material for a next application to a component while using a sensor system or a set distance advance process. The method may further comprise placing the components in jigs such that the components are oriented for placement of the material onto the components. The components may comprise lids or integrated heat spreaders of integrated circuit (IC) packages, board level shields, heat sources (e.g., a central processing unit (CPU), etc.), heat removal/dissipation structures or components (e.g., a heat spreader, a heat sink, a heat pipe, a vapor chamber, a device exterior case or housing, etc.), etc. The method may further comprise heating and/or cooling during the tamping and/or removing.

Another exemplary embodiment includes an integrated heat spreader and a thermal interface material or other material applied (e.g., tamped and cut, transferred form a supply, etc.) thereon by a system or method disclosed herein. An electronic device may include the integrated heat spreader of claim and central processing unit or processor die. The integrated heat spreader may be operable for spreading heat generated by operation of the central processing unit or processor die.

Another exemplary embodiment includes a board level shield (BLS) and a thermal interface material or other material applied (e.g., tamped and cut, transferred from a supply, etc.) thereon by a system or method disclosed herein. The BLS may be suitable for use in providing electromagnetic interference (EMI) shielding for at least one component on a substrate. The BLS may comprise one or more sidewalls defining an opening and configured for installation to the substrate generally about the at least one component on the substrate, and a lid configured to cover the opening defined by the one or more sidewalls. The thermal interface material may be applied to the lid. When the one or more sidewalls are installed to the substrate generally about the at least one component and the lid is covering the opening defined by the one or more sidewalls, the thermal interface material and the lid may cooperate to define a thermally-conductive heat path from the at least one component, and the BLS may be operable for providing EMI shielding for the at least one component. The lid may be integral with or removably attachable to the one or more sidewalls.

Another exemplary embodiment includes an assembly comprising a heat removal/dissipation structure, a printed circuit board having a heat source, and a board level shield having a thermal interface material or other material applied (e.g., tamped and cut, transferred from a supply, etc.) thereon by a system or method disclosed herein. The one or more sidewalls are installed to the printed circuit board with the opening over the at least one component. The lid is positioned on the one or more sidewalls such that the opening defined by the one or more sidewalls is covered by the lid. The thermal interface material and the lid cooperate to define a thermally-conductive heat path from the heat source to the heat removal/dissipation structure. The board level shield is operable for providing EMI shielding for the heat source. The heat removal/dissipation structure may be a heat spreader. The heat source may be an integrated circuit on the printed circuit board.

A wide range of thermal interface materials and other materials (e.g., non-thermally enhanced materials, thermal insulators, dielectric insulation, electrical insulators, electrically-conductive elastomers, EMI absorbers, EMI shielding materials, polymeric materials, adhesive materials, other interface materials, combinations thereof, individual layers thereof, stacked layers thereof, etc.) may be used in exemplary embodiments for the material 120 shown in FIG. 2. Advantageously, exemplary embodiments disclosed herein may allow a TIM to be made that will have relaxed properties over current TIMs. Ease of handling and application are important for TIMs, although softness, shear thinning, and modulus that help performance result in more difficult to apply materials. The exemplary application processes disclosed herein may allow materials that are typically hard to apply but have better performance to be applied easier.

Example thermal interface materials that may be used in exemplary embodiments include thermal gap fillers, thermal phase change materials, thermally-conductive EMI absorbers or hybrid thermal/EMI absorbers, thermal putties, thermal pads, etc. For example, exemplary embodiments may include a thermally-conductive EMI absorbers or hybrid thermal/EMI absorbers tamped, cut, and applied to a portion of an EMI shield, such as a cover or lid of a board level shield.

Example embodiments may include one or more thermal interface materials of Laird, such as any one or more of the Tputty™ 502 series thermal gap fillers, Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, Tpcm™ 780 series phase change materials, Tpcm™ 900 series phase change materials etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc. In some exemplary embodiments, the thermal interface material may comprise a compliant gap filler having high thermal conductivity. By way of example, the thermal interface material may comprise a thermal interface material of Laird, such as one or more of Tflex™ 200, Tflex™ HR200, Tflex™ 300, Tflex™ 300TG, Tflex™ HR400, Tflex™ 500, Tflex™ 600, Tflex™ HR600, Tflex™ SF600, Tflex™ 700, Tflex™ SF800 thermal gap fillers.

The thermal interface materials disclosed herein may comprise an elastomer and/or ceramic particles, metal particles, ferrite EMI/RFI absorbing particles, metal or fiberglass meshes in a base of rubber, gel, or wax, etc. The thermal interface materials may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. The thermal interface materials may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface materials to closely conform (e.g., in a relatively close fitting and encapsulating manner, etc.) to a mating surface when placed in contact with (e.g., compressed against, etc.) the mating surface, including a non-flat, curved, or uneven mating surface.

The thermal interface materials disclosed herein may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the first and/or second thermal interface materials may include ceramic filled silicone elastomer, boron nitride filled silicone elastomer, or a thermal phase change material that includes a generally non-reinforced film.

Exemplary embodiments may include one or more thermal interface materials having a high thermal conductivity (e.g., 1 W/mK (Watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the thermal interface material and loading percentage of the thermally conductive filler, if any. These thermal conductivities are only examples as other embodiments may include a thermal interface material with a thermal conductivity higher than 6 W/mK, less than 1 W/mK, or other values and ranges between 1 and 6 W/mk. Accordingly, aspects of the present disclosure should not be limited to use with any particular thermal interface material as exemplary embodiments may include a wide range of thermal interface materials and other materials (e.g., non-thermally enhanced materials, thermal insulators, dielectric insulation, electrical insulators, electrically-conductive elastomers, EMI absorbers, EMI shielding materials, polymeric materials, adhesive materials, other interface materials, combinations thereof, individual layers thereof, stacked layers thereof, etc.).

The thermal interface materials and/or other materials applied by the systems and methods disclosed herein may include one or more suitable fillers and/or additives added to achieve various desired outcomes. Example fillers include pigments, plasticizers, process aids, flame retardants, extenders, etc. For example, tackifying agents, etc. may be added to increase the tackiness of a thermal interface material or other material, etc. By way of further example, the thermal interface materials and/or other materials applied by the systems and methods disclosed herein may include electromagnetic interference (EMI) or microwave absorbers, electrically-conductive fillers, and/or magnetic particles so as to be operable or usable as an EMI and/or RFI shielding material. Examples of which include carbonyl iron, iron silicide, iron particles, iron-chrome compounds, metallic silver, carbonyl iron powder, SENDUST (an alloy containing 85% iron, 9.5% silicon and 5.5% aluminum), permalloy (an alloy containing about 20% iron and 80% nickel), ferrites, magnetic alloys, magnetic powders, magnetic flakes, magnetic particles, nickel-based alloys and powders, chrome alloys, and any combinations thereof. The thermal interface materials and/or other materials applied by the systems and methods disclosed herein may include one or more EMI absorbers formed from one or more of the above materials where the EMI absorbers comprise one or more of granules, spheroids, microspheres, ellipsoids, irregular spheroids, strands, flakes, powder, and/or a combination of any or all of these shapes.

A wide range of materials may be used in exemplary embodiments disclosed herein for the lids (broadly, parts) including electrically-conductive materials, such as metals (e.g., aluminum, copper, etc.), alloys, natural graphite, synthetic graphite, or other suitable materials, etc. By way of example, a non-exhaustive list of exemplary materials from which the EMI shield or portion thereof may be made include cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

In addition, the thermal interface materials and other materials disclosed herein may applied to a wide range of parts or components, including lids or integrated heat spreaders of integrated circuit (IC) packages, board level shields (e.g., a removable lid or cover of a board level shield (BLS), etc.), heat sources (e.g., a central processing unit (CPU), etc.), heat removal/dissipation structures or components (e.g., a heat spreader, a heat sink, a heat pipe, a vapor chamber, a device exterior case or housing, etc.), etc. Accordingly, aspects of the present disclosure should not be limited to use with any single type of part or component or limited to application to any specific location or portion of a part or component.

In exemplary embodiments, a portion of a thermal interface material or other material may be removed from a supply and applied to a lid or cover of a board level shield (BLS). The BLS lid or cover may be integral with or removably attachable to sidewalls of the BLS. For example, the BLS may include sidewalls that are integrally formed with the upper surface, cover, lid, or top of the BLS. For example, the sidewalls and upper surface may be formed by stamping the same electrically-conductive piece of material and then folding the stamped material such that the sidewalls are generally perpendicular to the upper surface. Alternatively, the sidewalls may be made separately and not integrally formed with the upper surface of the BLS. In some exemplary embodiments, the BLS may comprise a two-piece shield in which the upper surface, cover, lid, or top is removable from and reattachable to the sidewalls. In some exemplary embodiments, the BLS may include one or more interior walls, dividers, or partitions that are attached to and/or integrally formed with the BLS. In such exemplary embodiments, the BLS cover, sidewalls, and interior walls may cooperatively define a plurality of individual EMI shielding compartments.

In some exemplary embodiments, multiple material portions may be removed (e.g., pushed, pressed, tamped, removed, severed, torn, cut, blown, etc.) from one or more supplies (e.g., one or more rolls, reels, or tapes of one or more of the same, different, and/or multilayered materials, etc.) and applied to either or both sides of the components or substrates. For example, multiple different portions of the same thermal interface material (or other material) may be removed from a single supply of the thermal interface material and applied along the lower or inner side of a BLS lid or cover (or other component). The multiple different portions may be removed and applied from the single supply separately (e.g., sequentially, successively, consecutively, etc.) or simultaneously. Or, for example, multiple different portions of the same thermal interface material (or other material) may be removed and applied from different supplies separately or simultaneously. As another example, multiple different portions of different materials may be removed and applied from different supplies of the different materials separately or simultaneously. The multiple different portions may be adjacent (e.g., abutting, in contact, etc.) or spaced apart from each other along the BLS lid or cover. Additionally, or alternatively, the multiple different portions may be stacked on top of each other along the lower or inner side of a BLS lid or cover.

The TIM or other material portions applied along an inner side of a BLS lid or cover may have the same thickness or different thicknesses to accommodate for varying heights of the devices, components, etc., that will be under the BLS. The TIM or other material portions applied along an outer side of the BLS lid or cover may also have the same thickness or different thicknesses to accommodate for varying thicknesses of the heat spreader, heat sink, other heat removal/dissipation structures, etc.

In exemplary embodiments, the supply of material may comprise a single roll, reel, tape, or other supply of a single layer of material or a multilayered material. In other exemplary embodiments, the supply of material may comprise multiple rolls, reels, tapes, or other supplies of a single layer of material, which material may be the same or different for the multiple supplies. In additional exemplary embodiments, the supply of material may comprise multiple rolls, reels, tapes, or other supplies of a multilayered material, which multilayered material may be the same or different for the multiple supplies. In still further exemplary embodiments, the supply of material may comprise at least one roll, reel, tape, or other supply of a single layer of material and at least one roll, reel, tape, or other supply of a multilayered material. In some exemplary embodiments, the supply of material may comprise a supply (e.g., carrier tape, etc.) having pockets or cavities in which are positioned the material portions (e.g., portions of the TIM or other material, etc.) to be applied (e.g., blown out from within the pockets, mechanically removed with pick-n-place equipment, etc.). In exemplary embodiments, portions from the one or more supplies of materials may be removed and applied separately (e.g., sequentially, successively, consecutively, etc.) or simultaneously.

In exemplary embodiments, a system may be used for removing portions of a material (e.g., TIM, etc.) from a supply (e.g., reel, roll, tape, etc.) and applying or transferring the material portions to components. By way of example, the system may cut the material portions from the supply, which cutting process may also transfer the cut material portions to the components. Or, for example, the system may shape and/or size the material portions, which shaping and/or sizing process may also transfer the shaped and/or sized material portions to the components. As another example, the system may deform the material portions, which deforming process may also transfer the deformed material portions to the components. As yet another example, the system may imprint and tear the material portions, which process may also transfer the material portions to the components.

Example embodiments disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

Exemplary embodiments may provide one or more (but not necessarily any or all) of the following features or advantages, such as the elimination of tabs and reduced costs as compared to some conventional phase change material (PCM) application processes having tabbed parts that add high cost. Exemplary embodiments may help solve problems such as issues that customers have in applying tabbed parts correctly, issues with liner release, limitations on part configuration, shape and size, difficulty in a keeping material clean during additional steps after forming in a clean room, and/or shipping tabbed parts without distortion. Exemplary embodiments disclosed herein may allow a standard material (e.g., standard width, thickness, and/or length, etc.) to be provided, which may then be used with different dies that can be changed as needed for various shapes and sizes. Exemplary embodiments disclosed herein may provide a relatively simple forming design from pot to finished rolls, may provide a compact process and smaller clean room requirements (Type 2), may only require limited work-in-progress (WIP) dollars, may allow for a relatively simple/smaller part numbers list, thickness of PCM and width, may allow for a wide variety of die shapes and parts (e.g., FIG. 3, etc.) that are not feasible in tabbed format cost effectively, may allow the smallest size providable to become a non-issue (e.g., FIG. 3, etc.), may allow liner release variance issues to be less of an issue, and/or may allow extrusion screened "clean" material to stay between liners until applied to lid. In some exemplary embodiments, the TIM may be applied quickly and without distortion or trapped air, and the parts may be clean without pump out.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A system for applying materials to components, the system comprising a tool operable for transferring a portion of a material from a supply of the material to a component, wherein the tool includes a resilient material integral with the tool and configured for both tamping the portion of the material onto the component and imprinting the portion of the material for release and transfer from the supply when the tool including its integral resilient material are collectively downwardly moved relative to the portion of the material for downwardly severing the portion of the material from the supply thereby transferring the portion of the material onto the component;
   wherein the tool comprises a die integrally including:
      the resilient material; and
      a cutting portion configured for cutting the portion of the material for release and transfer from the supply;
   whereby when the tool including its resilient material and cutting portion are downwardly moved collectively in a single action relative to the portion of the material:
      the resilient material of the tool is operable for both tamping the portion of the material onto the component and imprinting the portion of the material for release and transfer from the supply; and
      the cutting portion of the tool is operable for cutting the portion of the material for release and transfer from the supply.

2. The system of claim 1, further comprising the supply of material including a liner along a surface of the portion of the material, wherein the tool is operable for transferring the portion of the material from the liner to the component.

3. The system of claim 2, wherein the tool is operable for pushing the liner downwardly through the portion of the material for downwardly severing the portion of the material from the supply without cutting the liner and thereby transferring the portion of the material onto the component without having to puncture the liner.

4. The system of claim 2, wherein the tool is operable for forcing the liner down into the portion of the material such that a thickness of the portion of the material is reduced or pushed out of the way, thereby providing the portion of the material with tapered edges in a thickness dimension along all sides.

5. The system of claim 2, wherein the system is configured such that the portion of the material remains on the component and such that the liner is automatically removed from the portion of the material by the tool when the tool is removed and moved relatively away from the portion of the material.

6. The system of claim 2, wherein the system is configured such that the portion of the material remains on the component and such that at least a portion of the liner remains on the portion of the material when the tool is removed and moved relatively away from the portion of the material.

7. The system of claim 2, wherein:
   the portion of the material comprises a non-metal; and
   the portion of the material is coupled to the component without any diffusion bonding or welded joints therebetween.

8. The system of claim 1, wherein the supply of material comprises a supply of thermal interface material having a high thermal conductivity, and wherein the tool is operable for transferring a conformable thermal pad of the thermal interface material from the supply to the component.

9. The system of claim 1, wherein the resilient material is shaped to mitigate air entrapment and remove air pockets from the portion of the material.

10. The system of claim 1, wherein:
    the component comprises an integrated circuit including one or more edges configured to imprint the portion of the material for release and transfer from the supply; and
    the tool is operable for completing the release and transfer of the imprinted portion of the material from the supply to the integrated circuit.

11. The system of claim 1, wherein:
    the component comprises an integrated circuit; and
    the tool is operable for tamping the portion of the material from the supply onto the integrated circuit such that one or more edges of the integrated circuit cut or tear the portion of the material for release and transfer from the supply.

12. The system of claim 1, wherein the supply of material comprises a supply of thermal interface material having a high thermal conductivity, and wherein the tool is operable for transferring a pad of the thermal interface material from the supply to the component without trapped air within the pad.

13. The system of claim 1, wherein the supply of material comprises a supply of thermal interface material having a high thermal conductivity, and wherein the tool comprises a knife die having a cavity or core filled with the resilient material usable for tamping a portion of the thermal interface material onto the component before the knife die severs the portion of the thermal interface material from the supply of thermal interface material.

14. A system for applying materials to components, the system comprising a tool operable for transferring a portion of a material from a supply of the material to a component, wherein the tool includes a resilient material integral with the tool and configured for both tamping the portion of the material onto the component and imprinting the portion of the material for release and transfer from the supply when the tool including its integral resilient material are collectively downwardly moved relative to the portion of the material for downwardly severing the portion of the material from the supply thereby transferring the portion of the material onto the component;
wherein the system comprises the supply of material including a liner along a surface of the portion of the material;
wherein the tool is operable for transferring the portion of the material from the liner to the component;
wherein the liner includes at least one portion having a different thickness that is preexisting along the liner before the portion of the material is transferred from the liner to the component and that is configured to texture the surface of the portion of the material when the tool is pressed against the liner to transfer the portion of the material from the liner to the component.

15. The system of claim 14, wherein the tool comprises a die integrally including:
the resilient material; and
a cutting portion configured for cutting the portion of the material for release and transfer from the supply;
whereby when the tool including its resilient material and cutting portion are downwardly moved collectively in a single action relative to the portion of the material:
the resilient material of the tool is operable for both tamping the portion of the material onto the component and imprinting the portion of the material for release and transfer from the supply; and
the cutting portion of the tool is operable for cutting the portion of the material for release and transfer from the supply.

16. A system for applying materials to components, the system comprising a tool operable for transferring a portion of a material from a supply of the material to a component, wherein the tool includes a resilient material integral with the tool and configured for both tamping the portion of the material onto the component and imprinting the portion of the material for release and transfer from the supply when the tool including its integral resilient material are collectively downwardly moved relative to the portion of the material for downwardly severing the portion of the material from the supply thereby transferring the portion of the material onto the component;
wherein the system comprises the supply of material including a liner along a surface of the portion of the material;
wherein the tool is operable for transferring the portion of the material from the liner to the component;
wherein the liner includes one or more protruding portions that are preexisting along the liner before the portion of the material is transferred from the liner to the component, and
wherein:
the one or more protruding portions of the liner comprise a thickness of an ink along the liner; and/or
the one or more protruding portions of the liner are configured to imprint into and texture the surface of the portion of the material.

17. A system for applying materials to components, the system comprising a tool operable for transferring a portion of a material from a supply of the material to a component, wherein the tool includes a resilient material integral with the tool and configured for both tamping the portion of the material onto the component and imprinting the portion of the material for release and transfer from the supply when the tool including its integral resilient material are collectively downwardly moved relative to the portion of the material for downwardly severing the portion of the material from the supply thereby transferring the portion of the material onto the component;
wherein the system comprises the supply of material including a liner along a surface of the portion of the material;
wherein the tool is operable for transferring the portion of the material from the liner to the component;
wherein:
the liner is configured to texture the surface of the material when the tool is pressed against the liner to transfer the portion of the material from the liner to the component; and/or
the liner includes electrically-conductive ink thereon transferrable from the liner to the portion of the material.

18. A system for applying materials to components, the system comprising a tool operable for transferring a portion of a material from a supply of the material to a component, wherein the tool includes a resilient material integral with the tool and configured for both tamping the portion of the material onto the component and imprinting the portion of the material for release and transfer from the supply when the tool including its integral resilient material are collectively downwardly moved relative to the portion of the material for downwardly severing the portion of the material from the supply thereby transferring the portion of the material onto the component;
wherein the system comprises the supply of material including a liner along a surface of the portion of the material;
wherein the tool is operable for transferring the portion of the material from the liner to the component;
wherein the system is configured such that the portion of the material remains on the component and such that at least a portion of the liner remains on the portion of the material when the tool is removed and moved relatively away from the portion of the material;
wherein the tool is configured to provide a cutting edge for cutting through the liner, and wherein the tool integrally includes the resilient material and the cutting edge such that when the tool including its integral resilient material and cutting edge are downwardly moved collectively in a single action relative to the portion of the material:
the resilient material of the tool is operable for both tamping the portion of the material onto the component and imprinting the portion of the material for release and transfer from the supply; and
the cutting edge of the tool is operable cutting through the liner.

19. A system for applying materials to components, the system comprising a tool operable for transferring a portion of a material from a supply of the material to a component, wherein the tool includes a resilient material integral with the tool and configured for both tamping the portion of the material onto the component and imprinting the portion of the material for release and transfer from the supply when the tool including its integral resilient material are collectively downwardly moved relative to the portion of the material for downwardly severing the portion of the material from the supply thereby transferring the portion of the material onto the component;

wherein the system comprises the supply of material that includes a supply of conformable thermal interface material having a thermal conductivity of at least 1 Watt per meter per Kelvin, and wherein:

the tool integrally includes the resilient material and a severing portion that is configured for severing a portion of the conformable thermal interface material from the supply thereby transferring the portion of the conformable thermal interface material onto the component, such that when the tool including its integral resilient material and severing portion are downwardly moved collectively in a single action relative to the portion of the conformable thermal interface material:

the resilient material of the tool is operable for both tamping the portion of the conformable thermal interface material onto the component and imprinting the portion of the conformable thermal interface material for release and transfer from the supply; and the severing portion of the tool is operable for severing the portion of the conformable thermal interface material thereby transferring the portion of the conformable thermal interface material onto the component.

20. A system for applying materials to components, the system comprising a tool operable for transferring a portion of a material from a supply of the material to a component, wherein the tool includes a resilient material integral with the tool and configured for both tamping the portion of the material onto the component and imprinting the portion of the material for release and transfer from the supply when the tool including its integral resilient material are collectively downwardly moved relative to the portion of the material for downwardly severing the portion of the material from the supply thereby transferring the portion of the material onto the component;

wherein the system comprises the supply of material that includes a supply of thermal interface material along a liner and that is naturally tacky, self-adherable to the components without additional adhesive, and has a thermal conductivity of at least 1 Watt per meter per Kelvin, and wherein:

the tool integrally includes the resilient material and a severing portion that is configured for severing a portion of the thermal interface material from the supply thereby transferring the portion of the conformable thermal interface material onto the component, such that when the tool including its integral resilient material and severing portion are downwardly moved collectively in a single action relative to the portion of the thermal interface material:

the resilient material of the tool is operable for both tamping the portion of the thermal interface material onto the component and imprinting the portion of the thermal interface material for release and transfer from the supply; and the severing portion of the tool is operable for severing the portion of the thermal interface material thereby transferring the portion of the thermal interface material onto the component.

\* \* \* \* \*